United States Patent [19]

Ciszek

[11] Patent Number: 5,047,112
[45] Date of Patent: Sep. 10, 1991

[54] METHOD FOR PREPARING HOMOGENEOUS SINGLE CRYSTAL TERNARY III-V ALLOYS

[75] Inventor: Theodore F. Ciszek, Evergreen, Colo.

[73] Assignee: The United States of America as represented by the United States Department of Energy, Washington, D.C.

[21] Appl. No.: 566,930

[22] Filed: Aug. 14, 1990

[51] Int. Cl.$^5$ ............................................. C30B 29/00
[52] U.S. Cl. ................................. 156/607; 156/617.1; 156/620.1; 156/620.5; 156/DIG. 70
[58] Field of Search ................. 156/607, 617.1, 620.1, 156/620.5, DIG. 70

[56] References Cited

U.S. PATENT DOCUMENTS

| | | | |
|---|---|---|---|
| 3,305,485 | 2/1967 | Burmeister et al. | |
| 3,622,399 | 11/1971 | Johnson | 420/580 |
| 3,716,345 | 2/1973 | Grabmaier | 156/620.2 |
| 4,167,554 | 9/1979 | Fisher | 156/607 |
| 4,196,171 | 4/1980 | Watanabe et al. | 156/DIG. 70 |
| 4,310,492 | 1/1982 | Nakanishi et al. | 156/620.2 |
| 4,894,206 | 1/1990 | Yamashita et al. | 422/249 |

FOREIGN PATENT DOCUMENTS

| | | | |
|---|---|---|---|
| 0206514 | 12/1986 | European Pat. Off. | 156/620.2 |
| 2158194 | 7/1987 | Japan | 156/617.1 |
| 2180469A | 9/1985 | United Kingdom | 156/620.2 |

OTHER PUBLICATIONS

"Solidus Boundary in the Gallium Arsenide-Gallium Phosphide Pseudobinary Phase Diagram", Foster et al., J Electrochem. Soc., 119 (10), 1426-7, (1972).
W. F. Leverton, Floating Crucible Technique for Growing Uniformly Doped Crystals, J. Appl Phys. 29, 1241-1244, (1958).
S. U. Airapetyants and G. I. Shmelev, Method for Growing Uniform Monocrystals of Alloyed Semiconductor Materials, Solid Solutions, and Intermetallic Compounds of a Given Composition Determined by the Composition of the Melt, Fiz. Tela 2, 747-755 (1960).
N. Kh, Abrikosov, L.D. Ivanova, O. G. Karpinskii, T. E. Svechnikova, and S. N. Chizhevskaya, Preparation and Proporties of Bladed Single Crystals of Solid Solutions Based on $Sb_2Te_3$, Izv. Akad, Navk SSR, Neorg. Mater,. 13, 641-644 (1977).
N. Kh. Abrikosov, T. E. Svechnikova, and S. N. Chizhevskaya, Doping Single Crystals of the Solid $Bi_2Te_{2.8-8}Se_{0.12}$ with Halids of Group V Elements, Izv Akad. Nauk SSSR, Neorg. Mater 14, 43-45 (1978).

Primary Examiner—Olik Chaudhuri
Assistant Examiner—Felisa Garrett-Meza
Attorney, Agent, or Firm—Kenneth Richardson; Hugh W. Glenn; William R. Moser

[57] ABSTRACT

A method for producing homogeneous, single-crystal III-V ternary alloys of high crystal perfection using a floating crucible system in which the outer crucible holds a ternary alloy of the composition desired to be produced in the crystal and an inner floating crucible having a narrow, melt-passing channel in its bottom wall holds a small quantity of melt of a pseudo-binary liquidus composition that would freeze into the desired crystal composition. The alloy of the floating crucilbe is maintained at a predetermined lower temperature than the alloy of the outer crucible, and a single crystal of the desired homogeneous alloy is pulled out of the floating crucible melt, as melt from the outer crucible flows into a bottom channel of the floating crucible at a rate that corresponds to the rate of growth of the crystal.

16 Claims, 1 Drawing Sheet

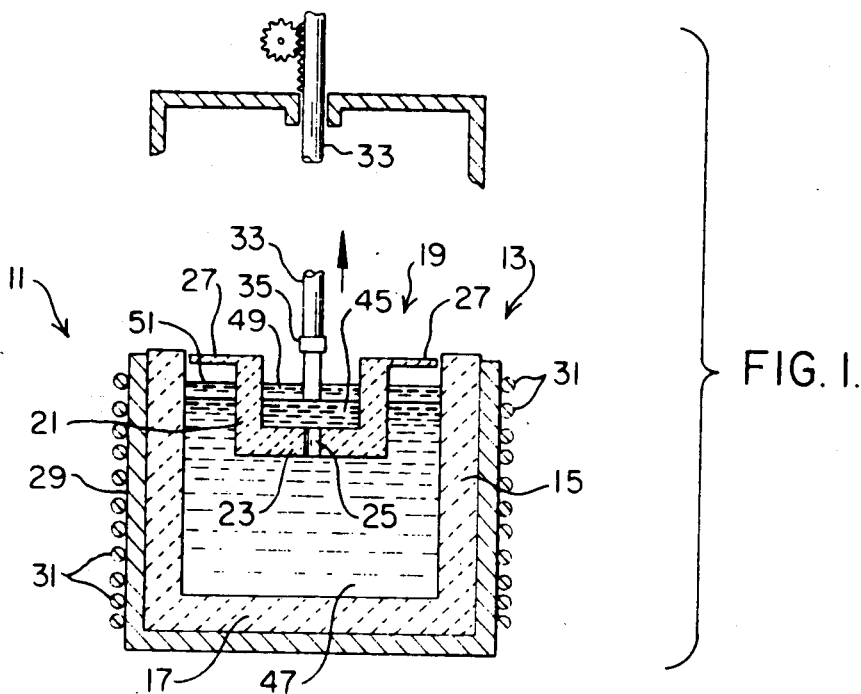
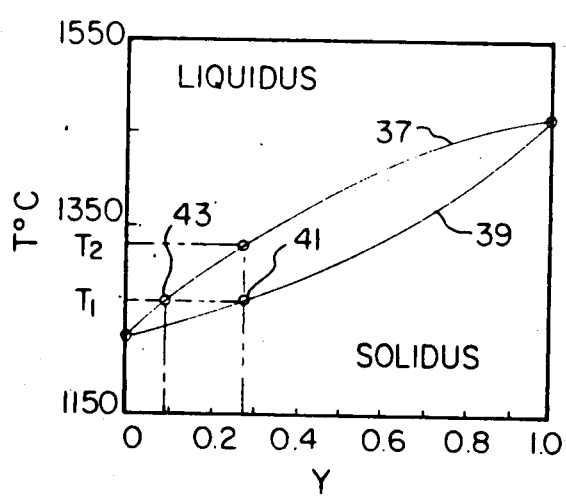
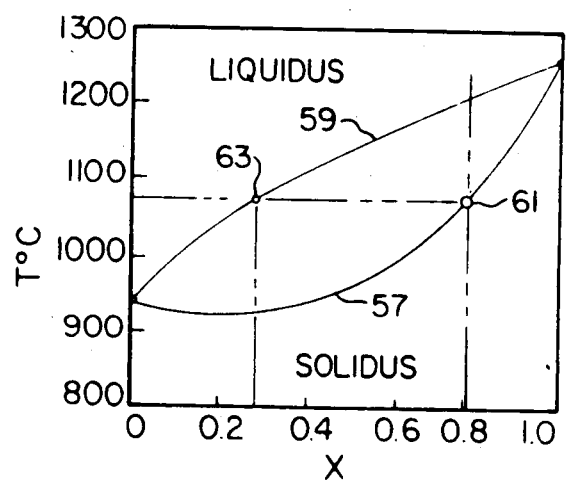
FIG. 1.
FIG. 2.
FIG. 3.

METHOD FOR PREPARING HOMOGENEOUS SINGLE CRYSTAL TERNARY III-V ALLOYS

CONTRACTUAL ORIGIN OF THE INVENTION

The United States Government has rights in this invention pursuant to Contract No. DE-AC02-83CH10093 between the U.S. Department of Energy and the Midwest Research Institute.

BACKGROUND OF THE INVENTION

1. Field of the Invention

This invention relates generally to the preparation of pseudo-binary alloys and relates more particularly to the preparation of homogenous, low-defect, single-crystal III-V alloys useful in high efficiency, multijunction solar cells.

2. Description of the Prior Art

The quality and efficiency of a solar cell in converting solar energy into electrical energy are largely determined by the cell materials and the cell configuration. The theoretical efficiency of a single-junction-configured cell, such as a single junction gallium arsenide (GaAs) cell, is only about 27.5%. To overcome this limitation the multi junction cascade or tandem solar cell has been proposed to obtain higher efficiencies by virtue of converting a greater portion of the solar spectrum than conventional cells. One approach which seem to be optimal, comprises a tandem cell of Group III-V alloys, which is in effect two solar cells in one. Each of the cells have having different band gaps arranged in such a way that one part of the solar spectrum is absorbed in a wide-band-gap material while the remaining part is absorbed in a narrow-band-gap material. The theoretical efficiency of such an arrangement is 36%. Discussion of such cells is included in a paper by J. C. Fan, B. Y. Tsaur, and B. J. Palm, entitled, "Optimal Design of High-Efficiency Tadem Cells," pp. Seventeenth IEEE Photovoltaic Specialists Conference, 692-701.

Materials that may prove suitable for such high-efficiency cells because from their outstanding properties, include semiconducting alloys formed from the compounds comprised of an element of Group III and an element of Group V of the Periodic Table particular interest are gallium aresenide phosphide "$GaAs_yP_{1-y}$" and gallium indium arsenide "$Ga_xIn_{1-x}As$". A great hindrance to developing this promising concept is the unavailability of suitable substrates upon which these materials can be grown. The principal requirement of the desired substrate is that it be highly matched in terms of lattice parameters with the cell layer. This is of great importance since mismatch is recognized as a major factor in limiting efficiency in a multijunction solar cell. Graded-layer epitaxy has been tried for growing the desired base cell on an available substrate, however this causes problems of interfacial dislocations. In addition, superlattice transitions and other approaches have been used, but mismatch problems persist.

In the III-V system, several ternary compositions including the above-mentioned ones are of great interest because they can give bottom cells with a 1.15 eV band gap and lattice-matched top cells with a 1.75 eV band gap. These gaps are near optimum for a two-cell PV converter and can combine to use enough of the solar spectrum to give a theoretical efficiency of about 36%.

No general process has heretofore been devised for satisfactorily producing bulk, single-crystal Group III-V pseudo-binary alloys of uniform composition.

A particular problem to be overcome in preparing single homogeneous crystals of pseudo-binary alloys stems from the inherent tendency of such alloys to form incongruently solidifying melts. For example, as a liquid mixture of a pseudo-binary alloy cools there will be a first-to-freeze part of the crystal that is substantially higher in one binary component than the last-to-freeze part of the crystal, giving a non-homogeneous crystal varying in composition over a wide range. This problem is more highly pronounced in materials of ternary III-V systems, which materials show solidus-liquidus curves with relatively large gaps between solidus and liquidus lines. Articles discussing such phenomena include J. W. Wagner 1970, "Preparation and Properties of Bulk $In_{1-y}Ga_yAs$ Alloys", J. Electrochem. Soc. Vol. 117, pp. 1193-1196; and F. Corrina, D. Margadonna, and P. Perfetti, 1973 "Growth of $GaAs_{1-x}P_x$ Crystals by Pulling From Gallium-Rich Solutions", J. Crys. Growth 18, pp. 202-204. Such crystal alloys can be made more homogeneous by very rapid quenching of the melt, but this results in a highly polycrystalline structure made up of very small crystals. Solid state recrystallization processes have been proposed to convert such homogeneous polycrystals into a single crystal. One such process is described in U.S. Pat. No. 3,622,399 wherein a ternary alloy, in homogeneous polycrystalline form is held under a thermal gradient in order to recrystallize it into a single homogeneous crystal. This is ordinarily followed by an annealing of the bulk crystal. In practice, when such techniques are used with the aforementioned candidate alloys of GaInAs and GaAsP, they are more likely to produce not a monocrystal, but rather at best a consolidation of the polycrystals into a fewer number of larger homogeneous crystals. It is also noted that solid state recrystallization processes do not appear to lend themselves to economic production required in industry because of lengthy time periods ordinarily required for annealing and cooling.

One technique that has been used to produce homogeneous crystals is the so-called floating crucible system. The article by W. F. Leverton, 1958 "Floating Crucible Technique for Growing Uniformly Doped Crystals", J. Appl. Phys. Vol. 29, pp. 1241-1244, describes producing uniformly dopes germanium crystals by drawing them up from a germanium melt in a crucible that floats on a germanium melt in an outer, larger crucible. The first mentioned crucible has a narrow duct in the bottom. During the drawing-up process melt from the larger outer crucible can flow through the narrow duct into the inner crucible. Such floating crucible systems have not been used to produce crystals of ternary III-V alloys.

There is another approach, shown in U.S. Pat. No. 3,305,485, that is specifically designed to produce single crystals from incongruently solidifying melts. A large supply crucible holds melt of the composition desired in the crystal. Spaced separately from the supply crucible is a small draw crucible, and a narrow tube extends from the supply vessel to the bottom of the draw crucible for conducting melt thereto. This approach is related to the floating crucible system to the extent that dual communicating crucibles are used; however it represents a deliberate departure from that system because of the concern that is stated in that disclosure regarding the adequacy of the floating crucible system in handling incongruently solidifying melts, particularly compounds with significant gaps between their solidus and liquidus lines.

In this regard it is noted that the floating crucible technique has been used for uniform growth and doping of $(Bi_{0.05}Sb_{1.5})Te$ and $Bi_2Te_{2.88}Se_{0.12}$. It has yet to be used with ternary III-V alloys such as those of the pseudo-binary systems $GaP_yAs_{1-y}$ and $Ga_xIn_{1-x}As$ which exhibit significantly larger gaps between their solidus and liquidus lines.

SUMMARY OF THE INVENTION

In view of the foregoing, it is a general object of the present invention to prepare substrate crystals of low-defect ternary crystals for high efficiency, multi junction solar cells, which crystals are lattice-matched with the cell material.

Another object of the invention is to provide a relatively quick method for producing bulk homogeneous single-crystal ternary III-V alloys.

Still another object of the present invention is to provide a method for producing substrate materials having lattice parameters which match those of the epitaxial cell to be grown on the substrate, and a band gap that is appropriate for the base cell of a multijunction device.

Yet another object of the present invention is to produce homogeneous single crystals from ternary III-V alloys which exhibit a wide gap between their solidus and liquidus lines.

A further object of the present invention is to provide a method of producing bulk single-crystal substrates of the pseudo-binary III-V systems $Ga_xIn_{1-x}As$ and $GaP_yAs_{1-y}$.

The method of the present invention advances the state of the art by producing ternary III-V alloys that have the advantage of serving both as substrates and bases for the active junctions of a high-efficiency, multi junction solar cell and said ternary III-V alloy materials are provided in the form of bulk, low-defect, single crystals, having a uniform composition.

The present invention represents a modification to the floating crucible method which unexpectedly is capable of producing low-defect, bulk, single ternary crystals despite the rather large solidus-liquidus gaps presented by the candidate alloys.

Accordingly, the present invention provides a method for preparing homogeneous, single-crystal ternary III-V alloys to serve as well-matched substrates for the substrate-side cell of a multi junction solar cell, and includes providing a first, outer crucible for holding a supply of molten mixture having the composition desired in the crystal to be produced, and a second, smaller crucible for holding a small quantity of molten alloy and adapted for placement within the first crucible so as to float on melt contained therein, and the bottom of the second crucible having a narrow channel for allowing the flow of molten material therethrough. In the outer crucible is provided a quantity of molten alloy having a composition that matches that of the crystal to be produced, and the inner crucible is provided with a small quantity of draw melt having the pseudo-binary liquidus composition which will freeze into the desired solidus composition of the crystal to be produced, and the invention most importantly includes maintaining the temperature of that draw melt at a predetermined lower temperature than the molten contents of the outer crucible. At this lower temperature, a single crystal of the desired composition is drawn out of the inner crucible as molten material from the outer crucible flows into the inner crucible by way of the channel at a rate that corresponds to the rate of growth of the crystal.

BRIEF DESCRIPTION OF THE DRAWINGS

The accompanying drawings which are incorporated in and form a part of the specification, illustrate preferred embodiments of the present invention and, together with the description, serve to explain the principles of the invention, wherein:

FIG. 1 is an elevational sectional view showing the drawing of a homogeneous crystal from a floating crucible arrangement according to the method of the present invention;

FIG. 2 shows a solidus-liquidus phase diagram of the $GaP_yAs_{1-y}$ pseudo-binary alloy system; and FIG. 3 is a solidus-liquidus phase diagram of the $Ga_xIn_{1-x}As$ pseudo-binary system.

DETAILED DESCRIPTION OF THE PREFERRED EMBODIMENTS

Referring now to the drawings, the apparatus of FIG. 1 is a floating crucible assembly 11, which includes a generally cylindrical outer crucible 13 with side wall 15 and bottom 17. An inner crucible 19, has side wall 21 and bottom 23 containing a narrow channel 25. Both crucibles are constructed of quartz or pyrolytic boron nitride, which material is preferable to available alternatives because of its low contamination risk. Several spacer arms 27 extend radially from the top of side wall 21 and terminate a short distance from the inside of wall 15 of the outer crucible, and it will be seen that these spacers 27 will serve to maintain the inner crucible 19 centrally with respect to the outer crucible, with inner crucible walls 21 held at a substantial, predetermined spacing from walls 15 of the outer crucible. The design of these spacer arms can be altered as needed to provide the required amount of buoyancy for the inner crucible 19. It will be seen that it is this centrally maintained spacing of the inner crucible which will keep it in a zone of lower temperature when it is in a floating configuration during crystal production, to be discussed hereinafter. A graphite sleeve or susceptor 29 snugly receives the outer crucible, and an rf heat induction coil 31 in turn surrounds the susceptor 29. The coil may be energized to induce a high temperature in the susceptor 29, which radiates and conducts heat through the walls of crucible 13 and towards its contents. A high-pressure puller (partially shown) is used in conjunction with the crucible assembly 11, and includes a vertically adjustable transport shaft 33 with a lower end equipped with a holder 35 for a seed crystal. The high-pressure seed puller includes walls defining a chamber (not shown) for containing a high-pressure inert gas, such as argon, for exerting a high pressure on the molten contents of the crucibles during their use in a manner to be described. A particularly preferred puller is the Model MSR-6, marketed by the Metals Research Division of Cambridge Instruments, Ltd.

At the outset the outer crucible 13 is filled with an alloy of the composition desired in the crystal to be grown, and the inner crucible is filled with material that will solidify into the desired composition. It will be seen that during operation, a crystal will be drawn up and out of if the inner crucible melt, and as this draw melt is depleted by solidification, new melt of composition equal to that removed by the crystal will enter through passage 25. The dimensions of opening 25 are chosen to avoid diffusion of the floating crucible contents into the outer crucible contents. These dimensions can be calculated based on the following equations: $D_L < VL$; $V = F_V/\pi r^2$; and $f_V > r^2 D_L/L$; where $D_L$ = diffusion coefficient of the draw melt; $V$ = linear velocity of the fluid entering the inner crucible; $L$ = length of the opening; $r$ = radius of the opening; and $f_V$ = volume growth rate of the crystal.

As pointed out herein previously, two ternary III-V alloys for high-efficiency, multi junction cells are $GaP_yAs_{1-y}$ for a wide-band-gap (1.75 eV) top cell and $Ga_xIn_{1-x}As$ for a narrow-band-gap (1.15 eV) bottom cell, these band gaps being near optimum for a two-cell PV converter. According to the invention these ternary III-V materials can be produced in bulk single-crystal form as lattice-matched substrates and bases for the active junctions of a cell. Given the band gap energy of 1.75 eV for $GaP_yAs_{1-y}$, the molar fraction y has been determined to be 0.275. Also, given the target band gap value of 1.15 eV for $Ga_xIn_{1-x}As$, the molar fraction x has been determined to be about 0.806. Such molar fraction derivations can be made theoretically by reference to an article by J. A. Van Vechten, entitled "Electronic Structures of Semiconductor Alloys," 1969 Phys. Rev. B1, 3351-3358 pp.

The invention will now be described more fully with respect to two embodiments of the method according to the invention, in which the device of FIG. 1 is used.

In the first embodiment, a bulk crystal alloy of the pseudo-binary system $GaP_yAs_{1-y}$ is produced. A solidus-liquidus phase diagram is shown in FIG. 2, in which temperature is plotted on the ordinate and molar friction on the abscissa. This phase diagram is derived from an article by L. M. Foster, J. E. Scardefield, and J. F. Woods entitled "The Solidus Boundary in the GaAs-GaP Pseudobinary Phase Diagram," published in 1972 in J. Electrochem. Soc. 119, pp. 1426-1427. The diagram includes a liquidus line 37 and a solidus line 39. It is noted that the point 41 on the solidus line corresponds to the target solid-phase composition of y=0.275. The liquid-phase composition, in equilibrium with this solid composition, is y=0.090, corresponding to point 43 on the liquidus line. According to the invention, this is the composition of the relatively small quantity of molten alloy that will comprise the draw melt 45, out of which the desired crystal will be grown. The outer crucible 13 will hold a significantly larger quantity of molten material comprising a supply melt 47, which has a composition that matches the target bulk crystal composition of y=0.275.

EXAMPLE 1

In carrying out the invention, raw materials are provided in the form of polycrystalline solid pieces of the required composition and quantity. The outer crucible 13 is loaded with a polycrystalline charge having a composition of $GaAs_{0.725}P_{0.275}$. The inner crucible is furnished with a small polycrystalline charge of the composition of $GaAs_{0.080}P_{0.180}$, and placed in the outer crucible 13. The aforementioned solid charges may be derived from molten mixtures of these compositions which are rapidly quenched according to conventional techniques, to form homogenous polycrystalline ingots.

Next, a small quantity of boric oxide ($B_2O_3$,) is added to each crucible. With the high-pressure puller in place and the high-pressure inert environment established, the coil 31 is energized to heat the graphite susceptor 29. Heating is continued to melt the contents of both crucibles to form a draw melt 45 in the inner crucible 19, with a layer 49 of less dense $B_2O_3$ floating thereupon. In the outer crucible a supply melt 47 forms, with a top layer 51 of $B_2O_3$. The volatile Group V elements will normally be evaporated from a high-temperature melt, however, the relatively high pressure of the inert atmosphere over the crucibles in conjunction with the physical barrier provided by the boric oxide encapsulant will prevent the escape of these elements.

The power to the rf coil 31 is adjusted to heat the draw melt 45 to about 1280° C. the temperature $T_1$ on the diagram. A seed crystal having a composition equal to that of the crystal to be produced, and attached to the holder 35 of the transport shaft 33 is dipped into the draw melt 45 and then pulled upwardly to initiate crystal growth of the target composition, according to the well known Czochralski pulling method. During this pulling up process, in order for the drawn crystal to maintain a homogenous composition, the composition of the draw melt 45 must remain fairly constant. This is achieved as the supply melt 47 flows continuously into the inner crucible 19 by way of passage 25, so as to replenish the draw melt with melt of y=0.275 composition. As this process is carried out it is important to maintain a temperature differential between the draw melt and the supply melt. In the present example, with reference to the diagram of FIG. 2, the temperature of the supply melt 47 is maintained somewhat above the temperature $T_2$, to avoid formation of solids therein. This represents a temperature difference of about 50° C. between crucible contents. This desired temperature differential is primarily achievable by virtue of the inner crucible 19 having a diameter which is significantly smaller than the inner diameter of the outer crucible 13, and being centrally remote from the heating source, in concert with the insulative effect of the inner crucible walls 23 and 21. In the present example, the ratio of 1:4 was established for diameter of inner crucible 19 to diameter of outer crucible 13.

Additional steps for maintaining a desired temperature differential are mentioned below regarding an example of the method of the invention applied to another Group III-V ternary system, which will require an even greater temperature differential.

Bulk single crystals of GaInAs may also be grown according to the method of the present invention, and a single crystal having a length of about 50 mm and a diameter that varied between 15 mm and 34 mm has been produced.

EXAMPLE 2

The production process for GaInAs alloy crystals is achieved in a procession of steps similar to those required in the preceding example involving $GaAs_{0.725}P_{0.275}$; however, it is apparent from the solidus-liquidus diagram of the pseudo-binary system of $Ga_xIn_{1-x}As$ as shown in FIG. 3 that a greater temperature difference between crucible contents must be maintained. This may be achieved by altering the geometry of the crucibles depicted in FIG. 1 by increasing the relative size difference of the crucibles to provide greater spacing between the walls of the inner crucible and the outer crucible, and by increasing the wall thickness of the inner crucible. Alteration of the rf heating coil to more preferentially heat the bottom of the outer crucible, and thus preferentially heat the lower portion of its molten contents, is another way to help attain the desired temperature differential. Further temperature control is attainable by cooling the inner crucible and its contents with a stream of cool inert gas directed selectively at the inner crucible and having a controlled, variable flow rate.

The solidus-liquidus diagram for the $Ga_xIn_{1-x}As$ pseudo-binary system is shown in FIG. 3. This diagram is derived from an article by T. Y. Wu and G. L. Pearson, 1972 "Phase Diagram, Crystal Growth, and Bond Structure of $Ga_xIn_{1-y}As$," J. of Phys. and Chem. of Solids Vol. 33, pp. 409–415. The diagram in FIG. 3 shows a solidus line 57 and a liquidus line 59. Note that point 61 on the solidus line corresponds to the target solid-phase composition of $x=0.806$. The liquid phase composition in equilibrium with the target solid is $x=0.270$, and corresponds to point 63 on the liquidus line.

Accordingly, in preparation for production, a polycrystalline charge of composition $x=0.806$ is prepared and placed in the outer crucible 13. The inner crucible is supplied with a small quantity of polycrystals having the composition $x=0.270$, and then boric oxide is added to both crucibles.

The contents of both crucibles are melted in a high-pressure inert environment using heating equipment and a high-pressure seed puller as used in the first example above, and rf coil heating power is controlled to set the temperature of the draw melt in the inner crucible at a temperature corresponding to point 61 on the solidus-liquidus diagram of FIG. 3. As the temperature of the supply melt is maintained above that of the draw melt by the required temperature differential, crystal growth is carried out using the Czochralski pulling method.

The foregoing examples are for illustrative purposes only, and the invention is not to be limited except as set forth in the following claims.

The embodiments of the invention in which an exclusive property or privilege is claimed are defined as follows:

1. A method for producing homogeneous, single-crystal ternary III-V alloys, comprising:
    a) providing a first low-contamination risk crucible for holding a first supply of ternary III-V molten alloy, and a smaller low contamination risk second crucible for holding a relatively smaller quantity of ternary III-V molten alloy; said smaller crucible being adapted for floating placement within said first crucible on said molten alloy and having a bottom wall with a channel of predetermined size to allow flow of molten alloy from said first crucible therethrough;
    b) placing in said first crucible a homogeneous quantity of ternary III-V molten alloy having a composition equal to a composition of the crystal to be produced;
    c) placing in said smaller crucible a quantity of molten ternary III-V alloy of a homogenous pseudo-binary liquidus composition differing from the composition of the crystal to be produced, and which will solidify into the composition of the crystal to be produced, and floating said smaller crucible on the molten contents of said first crucible;
    d) maintaining the contents of said smaller crucible at a predetermined temperature differential lower than the temperature of the contents of said first crucible; and
    e) drawing out of said smaller crucible a single crystal of a desired homogeneous composition, while melt from said first crucible flows into said channel of said smaller crucible at a rate that corresponds to a rate of growth of said crystal.

2. The method of claim 1 further including encapsulating upper surfaces of the molten alloy in said first crucible and said smaller crucible with a floating layer of $B_2O_3$, and maintaining the contents of said crucibles under a high-pressure inert gas environment to prevent vaporization of volatile Group V elements in said molten alloys.

3. The method of claim 2, wherein said smaller crucible and said first crucible are cylindrical, and said smaller crucible placed centrally within said first crucible is so that walls of said smaller crucible are spaced a predetermined distance from inner walls of said first crucible.

4. The method of claim 3, wherein said alloys are of a pseudo-binary system of $GaP_yAs_{1-y}$.

5. The method of claim 4, wherein the molten alloy in said smaller crucible has a composition wherein $Y=0.090$, and the molten alloy in said first crucible has a composition wherein $Y=0.275$.

6. The method of claim 3, wherein said alloys are of a pseudo-binary system of $Ga_xIn_{1-x}As$.

7. The method of claim 6, wherein the molten alloy in said smaller crucible has a composition wherein $x=0.270$, and the molten alloy in said first crucible has a composition wherein $x=0.806$.

8. The method of claim 3, wherein maintaining said temperature differential includes engaging said smaller crucible and its molten alloy with a stream of cool inert gas at a controlled and variable flow rate.

9. The method of claim 3, wherein maintaining said temperature differential includes using rf energy to preferentially heat a lower portion of the molten alloy of said first crucible.

10. The method of claim 8, wherein said alloys are of the pseudo-binary system $GaP_yAs_{1-y}$.

11. The method of claim 8, wherein said alloys are of the pseudo-binary system $Ga_xIn_{1-x}As$.

12. The method of claim 9, wherein said alloys are of the pseudo-binary system $GaP_yAs_{1-y}$.

13. The method of claim 9 wherein said alloys are of the pseudo-binary system $Ga_xIn_{1-x}As$.

14. The method of claim 1 wherein said first and said second low-contamination risk crucibles are composed of quartz.

15. The method of claim 1 wherein said first and said second low contamination risk crucibles are composed of pyrolytic boron nitride.

16. The method of claim 6, wherein said single crystal has a diameter in the range of 13 to 30 mm and a length of about 50 mm.

* * * * *